United States Patent [19]
Fukuda et al.

[11] Patent Number: 5,733,375
[45] Date of Patent: Mar. 31, 1998

[54] APPARATUS FOR SUPPLYING A TREATMENT MATERIAL

[75] Inventors: Takahide Fukuda; Shinichiro Izumi, both of Kumamoto; Yoshio Kimura, Kumamoto-ken; Yuuji Matsuyama, Kumamoto-ken; Satoshi Morita, Kumamoto-ken; Kunie Tsunematsu, Kumamoto, all of Japan

[73] Assignee: Tokyo Electron Limited, Tokyo, Japan

[21] Appl. No.: 580,620

[22] Filed: Dec. 29, 1995

[30] Foreign Application Priority Data

Jan. 6, 1995 [JP] Japan ................. 7-016469
Feb. 17, 1995 [JP] Japan ................. 7-053530

[51] Int. Cl.⁶ ................. C23C 16/00; B01F 3/04
[52] U.S. Cl. ................. 118/666; 118/694; 118/695; 118/708; 118/712; 118/726; 261/127; 261/131; 261/135; 261/141
[58] Field of Search ................. 118/726, 666, 118/694, 695, 708, 712; 261/127, 135, 131, 141

[56] References Cited

U.S. PATENT DOCUMENTS

| | | | |
|---|---|---|---|
| 4,563,312 | 1/1986 | Takimoto | 261/59 |
| 5,354,516 | 10/1994 | Tomita | 118/726 |
| 5,401,316 | 3/1995 | Shiraishi | 118/726 |
| 5,474,641 | 12/1995 | Otsuki | 118/719 |

*Primary Examiner*—Richard Bueker
*Attorney, Agent, or Firm*—Oblon, Spivak, McClelland, Maier & Neustadt, P.C.

[57] ABSTRACT

An apparatus for supplying a treating material to a treating device has a tank containing a liquid treating material and a heat exchanger formed by a spiral pipe and provided in the tank. A nitrogen gas ($N_2$ gas) is introduced into the tank and evaporates the liquid treating material. Water is supplied from a fluid inlet pipe connected to the lower portion of the exchanger to a fluid outlet pipe connected to the upper portion of the exchanger through the spiral pipe of the exchanger. In the heat exchange, heat exchange between the water and the liquid treating material is performed very efficiently. No use of electric power provides high safety. The temperature of the liquid treating material which is changed into a gas state by a bubbling process is controlled efficiently and the density of the vaporized treating material in the tank is made stable.

23 Claims, 6 Drawing Sheets

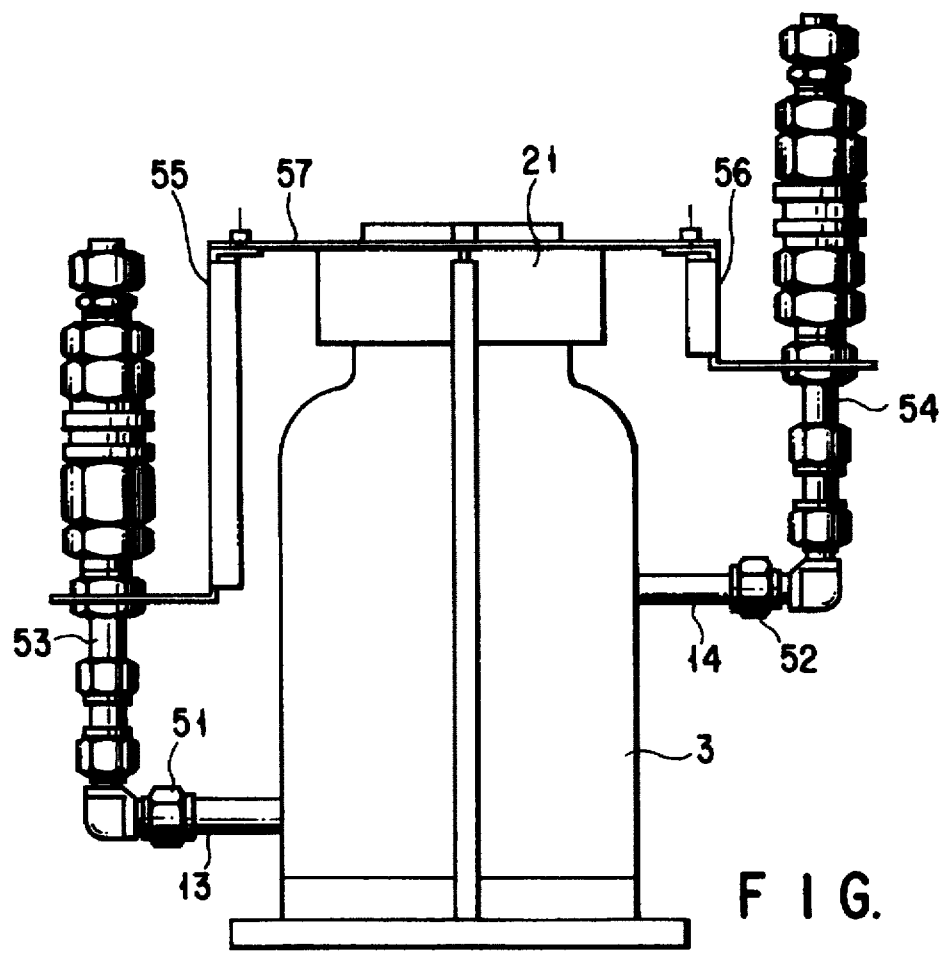
F I G. 4
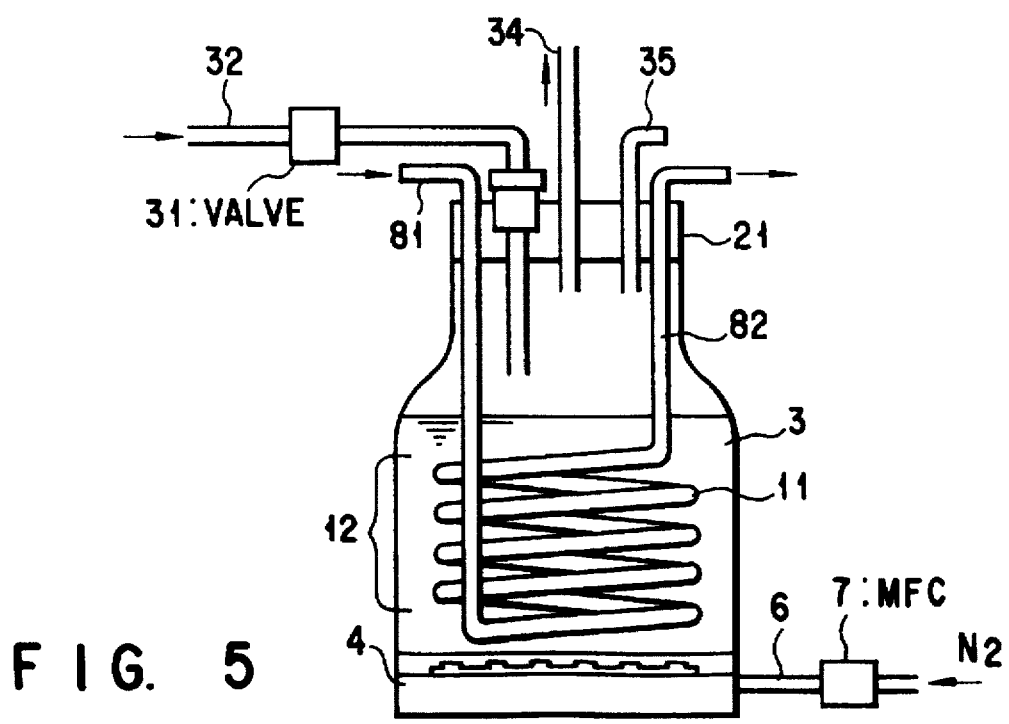
F I G. 5

APPARATUS FOR SUPPLYING A TREATMENT MATERIAL

BACKGROUND OF THE INVENTION

1. Field of the Invention

The present invention relates to an apparatus for supplying a treatment material.

2. Description of the Related Art

An apparatus for supplying a treatment material is used in a manufacturing process of articles such as semiconductor devices. With the supplying apparatus, a liquid treatment material is evaporated to be mixed with a carrier gas by a bubbling process or the like process, and the vaporized treatment material as well as the carrier gas is supplied to a device for treating an article such as a semiconductor wafer. HMDS (hexamethyldisilazane) used for surface-treating a semiconductor wafer, performing hydrophobolic treatment, or performing the like treatment is also sprayed onto the surface of the semiconductor wafer by means of the apparatus for supplying a treatment liquid.

Spray must be performed uniformly on the whole surface of the semiconductor wafer to improve the uniformity of the treatment of the semiconductor wafer. In order to do so, the amount of vaporized HMDS as a treatment material in a carrier gas such as a nitrogen gas must be maintained to a predetermined value. For blowing the carrier gas into the liquid treatment material and effecting bubbling, there have been proposed a method of controlling the amount of the blown carrier gas or a method of controlling the evaporated amount of the treatment material by maintaining the temperature of the liquid treatment material to a predetermined value.

Such conventional art or arts are disclosed in Japanese Laid-open Patent Application Publication No. 4-164325, Japanese Laid-open Patent Application Publication No. 4-222601, Japanese Laid-open Patent Application Publication No. 5-283340, etc. The conventional art comprises heating means provided outside of a tank and supplied with an electric power, for heating a tank which contains a treatment liquid. The heating means heats the treatment liquid in the tank to control the evaporated amount of the treatment material by regulating the temperature of the heated liquid.

In this technique, since the heating means is provided outside of the tank, heat is radiated to the surroundings of the tank, thereby deteriorating heating efficiency. The conventional art is not preferable because the surrounding instruments or devices are adversely effected by the generated heat and the treatment material supplying apparatus itself becomes too large. Also, heat transmission efficiency from the heating means to the liquid treatment material in the tank is poor because the heat is transmitted through the tank. Thus, large variation due to overshooting, undershooting or the like occurs when the temperature of the liquid treatment material is set to a predetermined value, and it takes a long time to set the temperature of the liquid treatment material to the predetermined value. In consequence, the throughput of the setting time is lowered.

When the treatment liquid is a flammable material such as HMDS and if it happens to leak out, an unexpected accident may occur. It is, therefore, necessary to improve the treatment material supplying apparatus.

A nitrogen gas as a carrier gas is supplied to a vaporized treatment material (HMDS) contained in the tank and bubbling is performed. The prior art has a problem in that an upper level or surface of the liquid treatment material is not controlled easily and accurately due to agitation or disturbance of the upper surface of the liquid produced by bubbling. With the conventional treatment supplying apparatus in particular, the level of the upper surface of the liquid treatment material is detected by a plurality of sensors such as an upper sensor and a lower sensor. When the upper and lower sensors are used, there is a gap between both sensors. Variation of the level of the upper surface of HMDS in the tank is large. In this respect, the density of the vaporized HMDS (the vapor density of HMDS) is not constant and HMDS is not supplied stably in the conventional treatment material supplying apparatus. At an excessively high density of HMDS, dew condensation is produced on the inner surface of the a supplying pipe and the inner surface of the treatment apparatus, causing particle pollution. When a special dilution line is provided to prevent an excessively high density of HMDS, the treatment apparatus becomes complicated, making it difficult to reduce the cost.

SUMMARY OF THE INVENTION

The object of the present invention is to provide an apparatus for supplying a treatment material, which efficiently controls the temperature of the liquid treatment material in a tank, stabilizes the density of the vaporized treatment material, is operated safely without giving adverse effect on the circumstances and has a compact structure.

In order to achieve the object, the present invention provides an apparatus for supplying a treatment material, in which a chemically stable gas in introduced into a tank containing a treatment material, the liquid treatment material is evaporated in the gas, and the vaporized treatment material is supplied to a treatment material supplying system. The apparatus has a heat exchanger for conducting heat exchange between the treatment material and a fluid flowing from the lower portion to the upper portion of the heat exchanger in a pipe.

Provision of the tubular heat exchanger in the tank containing the liquid treatment material allows for "liquid-to-liquid" heat exchange or "gas-to-liquid" heat exchange between the treating material and the fluid flowing in the pipe, thereby permitting temperature adjustment of the treatment material extremely efficiently. Since the heat exchanger itself is provided in the tank, heat is not radiated directly to the external devices. This apparatus does not employ a heating system heated by electric power, and the treatment material does not catch fire. Thus, the apparatus is safe.

The fluid in the pipe of the heat exchanger flows from the lower portion to the upper portion of the heat exchanger. Even if the amount of the liquid treatment material is reduced and the level of its upper surface is lowered in this arrangement, heat exchange is made by the portion of the fluid which has not yet been heat exchanged in the heat exchanger, leading to easy temperature control at a high efficiency. Heat of the fluid can be transmitted to the liquid treatment material at an extremely high efficiency so that the temperature of the liquid treatment material is controlled easily and efficiently. The instruments and devices around the tank are not adversely affected by the heat. Even if the liquid treatment material is flammable, it is not ignited and is used safely. As the heat exchanger is provided in the tank, the supplying apparatus can be made small. The tank containing the liquid treatment material is so constructed that a chemically stable gas can be introduced into the tank, the liquid treatment material can be evaporated to be mixed with the gas in the tank, and the vaporized treatment material can be supplied to the treatment material supplying system. A tubular heat exchanger is provided in the tank in such a way that the fluid flows in a pipe forming the heat exchanger from the lower portion to the upper portion of the heat exchanger. Since the fluid is the one also used for temperature control of the treatment apparatus, it is necessary to use any other special fluid than the one used in the treatment apparatus. Thus, the fluid can be used effectively and the running cost can be reduced.

The tank is so constructed that it contains the liquid treatment material and is supplied with a carrier gas, and the vaporized treatment material evaporated from the liquid treatment material in the tank is supplied to the treatment apparatus. By dividing the interior of the tank a plurality (two, for example) of portions and the upper surface of the liquid treatment material is made more stationary so that the level of the upper surface of the liquid treatment material is detected more accurately. In other words, when the carrier gas is supplied to one portion of the divided interior of the tank and the level of the upper surface of the liquid treatment material contained in the tank is detected in the other portion, little agitation or disturbance occurs on the upper surface of the liquid treatment material and the level of the upper surface can be detected in a more stable state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a front view of the HMDS supplying apparatus shown in FIG. 1;

FIG. 5 is a view schematically showing an HMDS supplying apparatus according to another embodiment of the present invention;

DETAILED DESCRIPTION OF THE PREFERRED EMBODIMENTS

A first embodiment according to the present invention will be described with reference to FIGS. 1 to 4. In this embodiment, as shown in FIG. 1, the present invention is applied to an HMDS supplying apparatus 2 for supplying vaporized treatment material such as vaporized HMDS (hexamethyldisilazane) 100 to a treating device (a gas treating device) 1 for performing required treatment on a to-be-treated article such as a semiconductor wafer (hereinafter simply referred to as the "wafer"), the treatment being such as an AD treatment (an adhesion treatment which is a pre-treatment of a photo resist coating process, and improves adherence and fixture of a photo resist to a wafer).

It should be noted that the present invention is not limited to the embodiments as will be described but is applicable to a tank such as a resist liquid tank, a developer tank, or the like other than the tank of the HMDS supplying apparatus.

Figure 1:
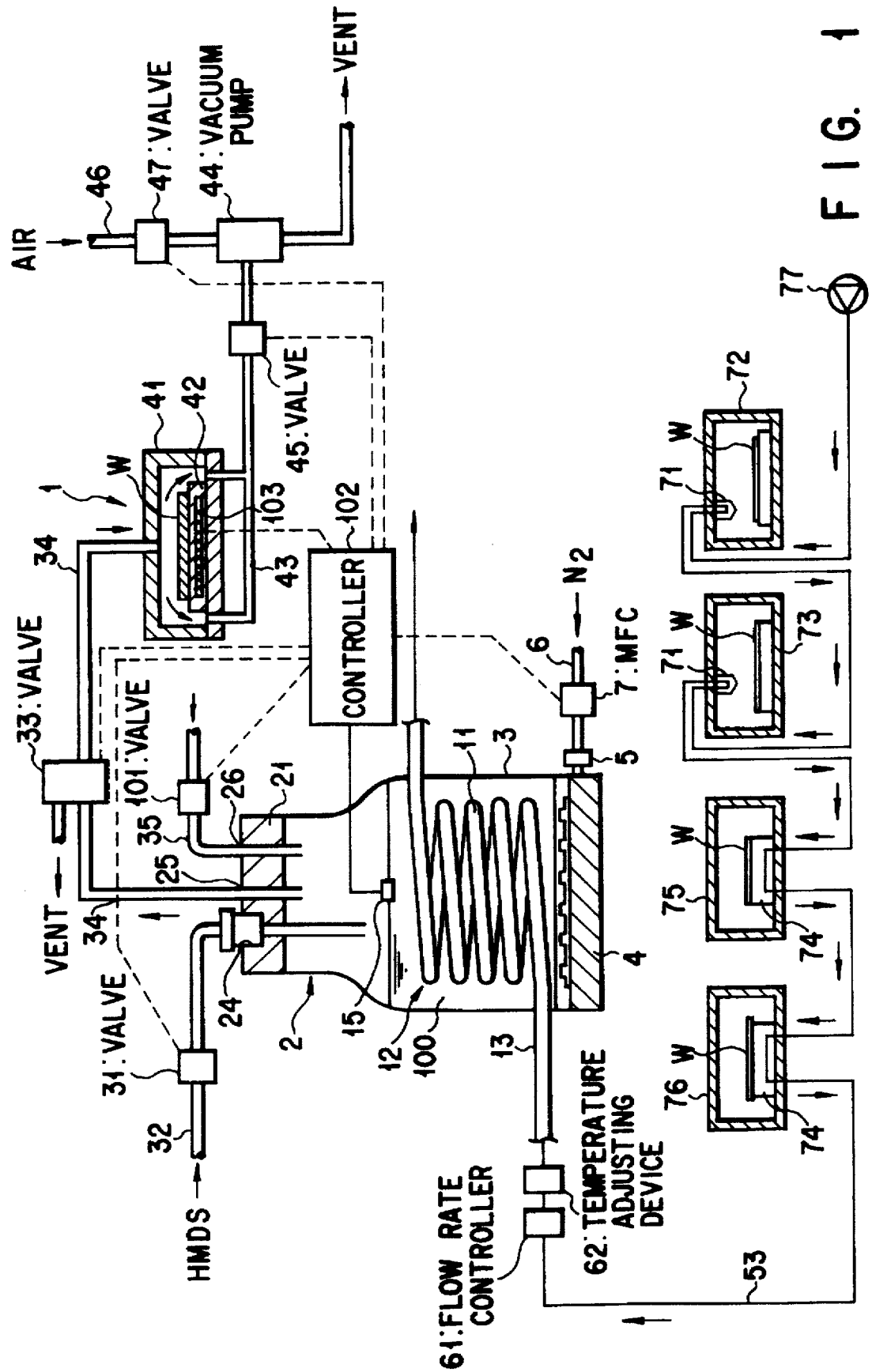
FIG. 1 is a view schematically showing a system including and an AD treatment apparatus using an HMDS supplying apparatus according to one embodiment of the present invention.
Figure 2:
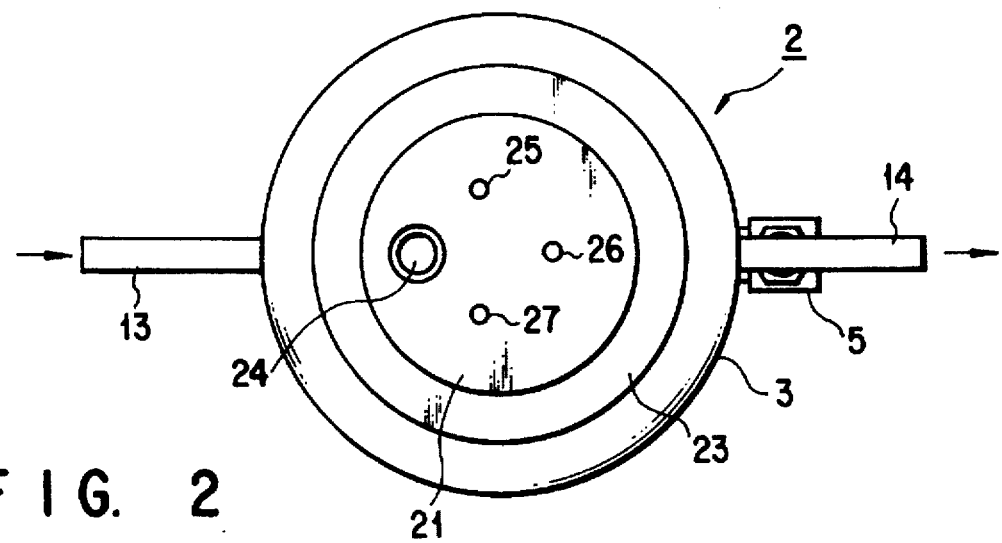
FIG. 2 is a plane view schematically showing the HMDS supplying apparatus shown in FIG. 1.
Figure 3:
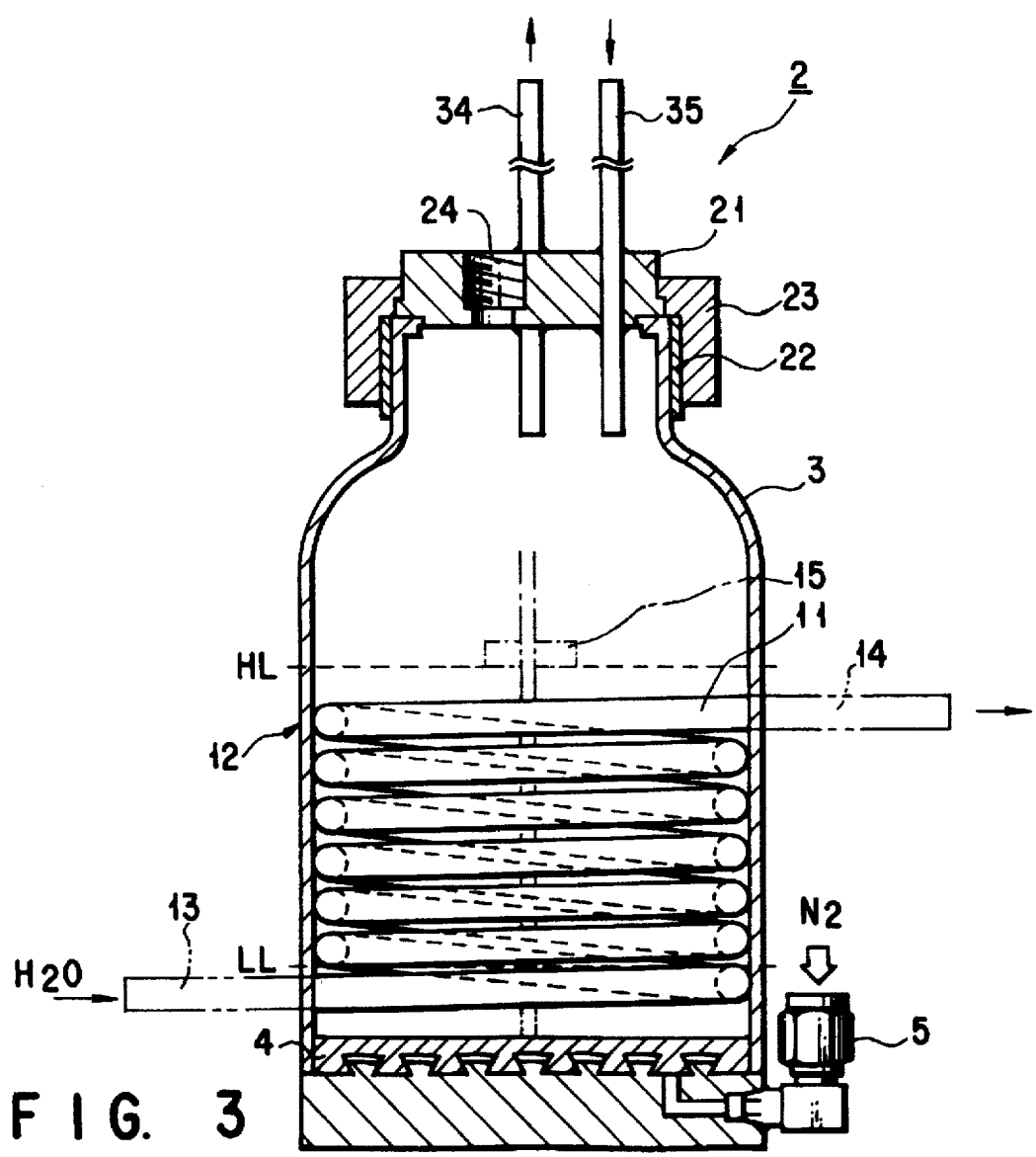
FIG. 3 is a cross-sectional view of the HMDS supplying apparatus shown in FIG. 1.

As shown in FIGS. 1 to 3, the HMDS supplying apparatus 2 has a tank 3 containing liquid HMDS 100 and made of PFA (perfluoalcoxy fluororesin) which has a highly chemical resistance against the treatment liquid or HMDS. At the bottom of the tank 3 is provided a bubble generator 4 made of a porous material. When a carrier gas such as a nitrogen gas ($N_2$ gas) is supplied to the bubble generator 4 from a coupler 5 provided externally of the bottom of the tank 3, fine bubbles of the $N_2$ gas are generated in the liquid HMDS 100 in the tank 3 and part of the HMDS is mixed with the $N_2$ bubbles in a form of vapor.

As shown in FIG. 1, the amount of bubbles and thus the amount of nitrogen gas ($N_2$ gas) supplied to the interior of the tank 3 can be controlled to a predetermined value by an MFC (a massflow controller—a flow control device) 7 provided on a nitrogen gas ($N_2$ gas) supplying pipe 6 one end of which is connected to the coupler 5 and the other end of which is connected to a gas source (not shown). Thus, the control of the flow rate of the nitrogen gas ($N_2$ gas) by the MFC 7 permits the control of the amount of vaporized HMDS 100.

Alternately, the temperature of the nitrogen gas ($N_2$ gas) may be directly controlled to adjust the vaporized amount of the HMDS 100.

In the tank 3 is housed a heat exchanger 12 comprising a spiral pipe 11 which is also made of the same material as that of the tank 3, or PFA having a highly chemical resistance against HMDS. A fluid for transmitting heat to the HMDS 100 such as water ($H_2O$) maintained to predetermined temperature such as a room temperature or a constant temperature is adapted to flow upward in the spiral pipe 11 from the lower position of the liquid HMDS 100 in the tank 3 toward the upper surface of the liquid HMDS 100. Temperature difference exists between the vicinity of the upper level and the vicinity of the bottom of the liquid HMDS if fluid does not flow upward in the spiral pipe 11. However, the upward movement of the fluid may make the temperature of the whole liquid HMDS 100 uniform.

To the lower portion of the heat exchanger 12 is connected a fluid inlet pipe 13 extending externally of the tank 3. To the upper portion of the heat exchanger 12 is connected to a fluid outlet pipe 14 extending also externally of the tank 3. As shown in FIG. 3, the spiral-shaped heat exchanger 12 is placed in such a position that the upper portion thereof is disposed under the upper level limit HL of the liquid HMDS 100 in the tank 3 and the lower portion thereof is preferably disposed over the lower level limit LL of the liquid HMDS 100.

The spiral structure of the heat exchanger 12 according to this embodiment restricts the vertical movement of a float sensor 15 provided in the tank 3, for detecting the amount of, for example, the liquid HMDS 100 contained in the tank 3.

A signal of the level of the upper surface of the liquid HMDS 100 contained in the tank 3, which level is detected by the float sensor 15, is inputted to a controller 102.

A cover member 21 is sealingly fitted in an opening formed in the top portion of the tank 3 by a seal member 22 and a lock member 23, as shown in FIG. 3. In the cover member 21 are formed an inlet 24 for injecting liquid HMDS into the tank 3, a supplying hole 25 for supplying vaporized HMDS from the tank 3 to the aforementioned treating device 1, an air hole 26 for causing the interior of the tank 3 to communicate with the outer atmosphere, and an extra hole 27 usually blocked by a blind plug.

As shown in FIG. 1, an HMDS supplying pipe 32 provided with opening/closing means for introducing HMDS into the tank 3 or for blocking HMDS such as a valve 31, is connected to the inlet 24.

To the supplying hole 25 is connected a supplying pipe 34 provided with a change-over valve 33 which selectively takes a state in which the treatment gas (an1 HMDS gas) is supplied to the treatment apparatus 1 and a state in which the interior of the pipe 34 is in a vent condition.

An air introducing pipe 35 is connected to the supplying hole 26 through an opening/closing valve 101 which selectively takes the state in which it sealingly closes the interior of the tank 3 and the state in which it causes the interior of the tank 3 to communicate with the outer atmosphere.

The valve 31, the change-over valve 33 and the opening/closing valve 101 can be opened or closed inpendently at predetermined timing, by the controller 102.

The supplying pipe 34 communicates with the top portion of the chamber 41 of the treating device 1. A mount base 42 is provided at the bottom portion of the chamber 41.

Since a piping system, i.e., the introducing pipe 35, the supplying pipe 34, a passage 110 (FIG. 6) and the HMDS supplying pipe 32 are connected to the cover member 21, the tank 3 can be replaced easily and the maintenance time can be shortened.

The vaporized HMDS supplied from the supplying pipe 34 is adapted to be sprayed onto the wafer W on the base 42 uniformly. In the mount base 42 in the chamber 41 is provided a heating device, such as a heater 103 for heating the wafer W to a predetermined temperature. The AD treatment of the wafer W is performed by spraying vaporized HMDS onto the wafer W with the temperature of the wafer W maintained at a predetermined value by the heating device.

To through holes in the bottom wall of the chamber 41 of the treating device 1 are connected branch portions of a vent pipe 43 for exhausting a gas after treatment. A vacuum device, such as an air ejector type vacuum device (an air-pressure type vacuum pump) 44 for producing a negative pressure in the chamber 41 is connected to the vent pipe 43 through an opening/closing valve 45. A driving air supplying pipe 46 for supplying pressurized driving air is connected to the vacuum device 44 through an opening/closing valve 47.

As shown in FIG. 4, the fluid introducing pipe 13 and the fluid outlet pipe 14 are supported by the cover member 21 through a fluid supplying pipe 53 and vent pipe 54 connected to the pipes 13 and 14 by joints 51 and 52, respectively, stays 55 and 56 fixed to the pipes 53 and 54, respectively, and a supporting member 57. Thus, when vibration occurs, the fluid introducing pipe 13, the fluid outlet pipe 14 and the pipe 11 of the heat exchanger 12 do not contact the tank 3 and/or another elements, and an excessive load is not applied to the penetrated portion of the tank 3 through which the pipes 13, 14 extend, whereby no damage is given to the pipes 13 and 14.

As shown in FIG. 1, water of adjusting and/or cooling the temperature of treatment apparatuses performing other treatments on the wafer W is supplied to the fluid supplying pipe 53 through a flow controlling device 61 and a temperature adjusting device 62.

In the vicinity of the treatment apparatus 1 for performing AD treatment are usually arranged various treatment apparatuses such as treatment apparatus for coating photo resist and cleaning, which are post-treatment. As shown in FIG. 1, with this embodiment, water used for adjusting the temperature of such other treatment apparatuses and/or cooling water is also used as a coolant of the heat exchanger 12. That is, water supplied by a pump 77 used for adjusting the temperature of nozzles 71 of treatment apparatuses 72 and 73 for dropping treatment liquid such as resist liquid, developing liquid or cleaning liquid onto wafers W and for cooling susceptors 74 in treatment apparatuses 75 and 76 for heat-treating wafers W on the susceptors 74 is reused as a cooling liquid. The water having passed through the susceptor 74 in the treatment apparatus 76 flows in the heat exchanger 12 through the fluid introducing pipe 13.

Alternately, the flowing route can be changed in such a manner that water having passed through the heat exchanger 12 flows through the treatment apparatuses 72, 73, 75 and 76.

The HMDS supplying apparatus 2 and its peripheral devices and instruments according to this embodiment are constructed as described above. HMDS 100 is supplied to the treatment apparatus 1 for performing AD treatment on the wafer W in the following way. The opening/closing valves 45 and 47 are opened by the controlled 102. Pressurized driving air is supplied from the driving air supplying pipe 46 to the vacuum device 44 and the gases in the chamber 41 of the treating device 1 are sucked and exhausted so that the pressure in the chamber 41 is reduced. Thereafter, the opening/closing valve 7 is opened to introduce nitrogen gas ($N_2$ gas) from the bubble generator 4 to the interior of the tank 3. The introduced nitrogen gas ($N_2$ gas) flows upwardly as fine bubbles in the HMDS 100 and part of HMDS 100 is evaporated and mixed with the $N_2$ bubbles. The nitrogen gas ($N_2$ gas) mixed with HMDS is supplied from the supplying pipe 34 to the interior of the chamber 41 of the treating device 1 and is caused to blow onto the wafer W mounted on susceptor 42 heated to a predetermined temperature. In this way, AD treatment is made on the wafer W. In this case, the amount of the supplied HMDS 100 must be maintained to a predetermined value. In order to do so, the temperature of the HMDS 100 in the tank 3 must be maintained to a predetermined value such as a room temperature of 23° C. so that the evaporating amount of HMDS may be controlled in addition to the flow control of the nitrogen gas ($N_2$ gas). In this embodiment, the heat exchanger 12 provided in the tank 3 always performs heat exchange between the liquid HMDS 100 and water ($H_2O$) heated to a temperature of, for example, 23° C. and flowing through the pipe 11 of the heat exchanger 12, through the water, and the temperature may be maintained to the predetermined value extremely stably. Since the water flows upward through the pipe 11 of the heat exchanger 12, heat is radiated to HMDS from part of the water whose controlled temperature is still maintained so as to perform heat exchange between the part of water and the HMDS 100 in the tank 3. Thus, the temperature of HMDS 100 may be controlled easily.

As the heat exchanger 12 is disposed in the HMDS 100 in the tank 3, the heat exchanger 12 does not perform heat exchange with the other portions, and thus can control and maintain the temperature of HMDS 100 extremely efficiently. In addition, heat is not radiated directly from the heat exchanger 12 to the peripheral devices and instruments. Water flowing through the heat exchanger 12 ensures safe use of a flammable liquid such as HMDS 100 and facilitates handling of the liquid. Further, the HMDS supplying apparatus 2 has a compact structure and has no external heating means as the conventional HMDS supplying apparatus has. Thus, the degree of freedom of layout of the peripheral devices and instruments may be improved.

In this embodiment, the spiral arrangement of the pipe constituting the heat exchanger 12 provides a large contacting area with the HMDS 100 so as to enhance the heat exchange efficiency and define the vertical movement of the float sensor 15. It is noted that the pipe constituting the heat exchanger 12 is not always formed spiral but may have any suitable shape.

In this embodiment, as the water used for the heat exchanger 12 is used water for adjusting and/or cooling the other treating devices 72, 73, 75 and 76. Thus, water used only for heat exchange is not required, and the whole system has no idle elements.

In place of the fluid inlet pipe 13 and the fluid outlet pipe 14 both penetrating the peripheral wall of the tank 3 in the first embodiment, a fluid inlet pipe 81 and a fluid outlet pipe 82 both extending through the cover member or cap 21 may be used as shown in FIG. 5. This arrangement simplifies the structure of the tank 3 assembly, strengthens it and improves its shape. Further, the tank 3 and the pipes 81 and 82 can be maintained easily.

A chemical stable gas in terms of each of the treatment apparatuses is a nitrogen gas ($N_2$ gas), for example. Besides, each of other various inert gases such as a helium gas (He gas) and argon gas (Ar gas) may be used. The fluid flowing in the HMDS supplying apparatus may be a liquid or gas. It is preferred that the fluid is so chemically stable substance that it does not react on the treating liquid when the fluid is in contact with the treatment liquid.

Although both the above-mentioned embodiments are applied to HMDS supplying apparatuses, the present invention may be applied to an apparatus for supplying vaporized treating material evaporated from the treating liquid in the tank to another treating device. In such a case, the temperature of the treating liquid can be set and maintained to a predetermined value. Thus, the present invention is applicable to an apparatus for supplying a liquid chemical material such as liquid developer, resist liquid magnetic powder containing solution or the like liquid.

Figure 6:
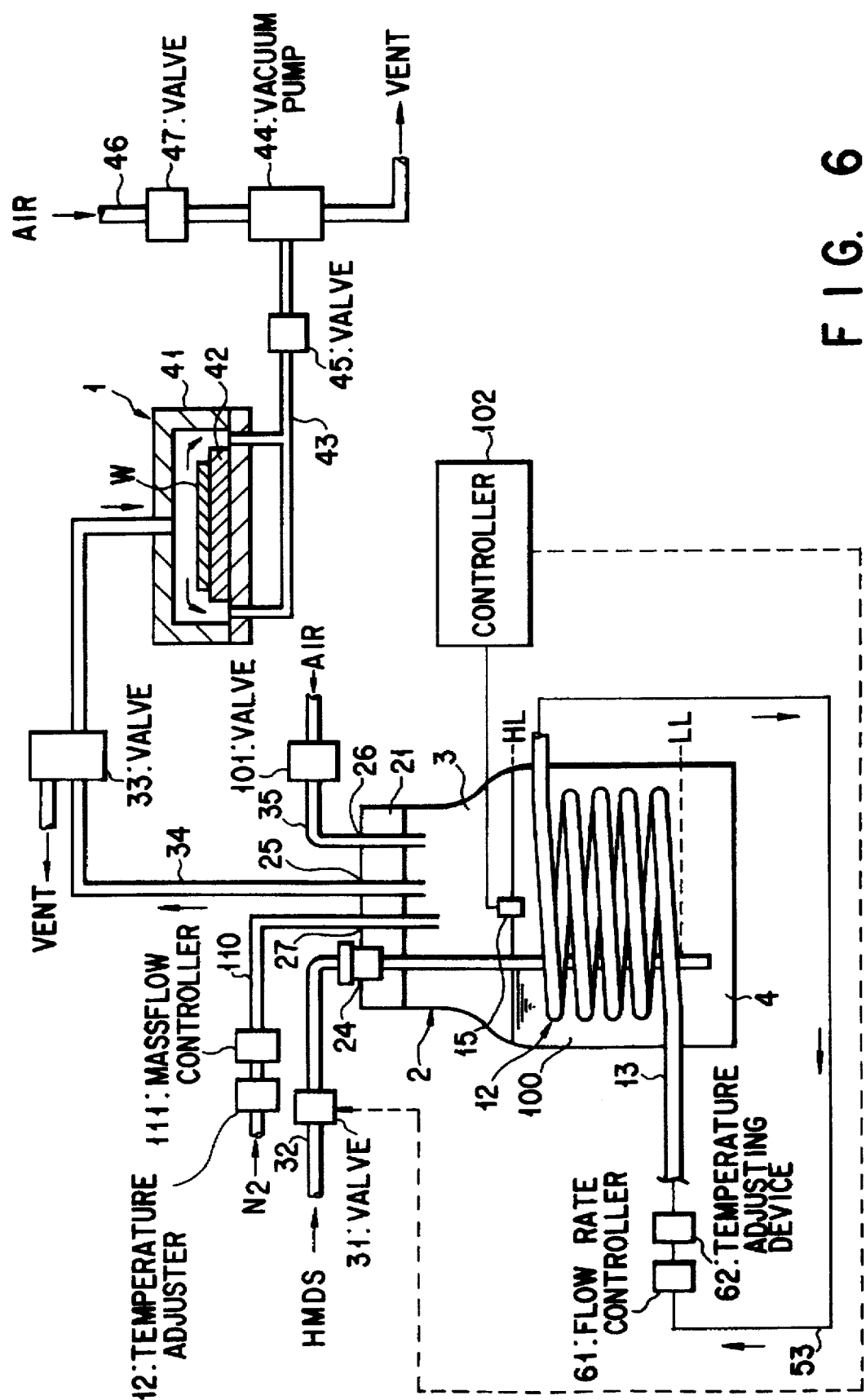
FIG. 6 is a view schematically showing a system including an AD treating device employing the HMDS supplying apparatus according to the embodiment of the present invention.

A treating material supplying apparatus according to another embodiment will be described with reference to FIG. 6. The substantially same elements and parts of this embodiment as those of the first and second embodiments will be denoted by the same reference numerals and signs.

The treating material supplying apparatus is an HMDS supplying apparatus 2 having a sealed tank 3 containing liquid HMDS 100 and made of PFA (perfluoalcoxy fluororesin) which has a highly chemical resistance against liquid HMDS 100. Liquid HMDS as a treatment liquid is supplied to the interior of the tank 3 through an HMDS supplying pipe 32. A valve 31 is provided on the HMDS supplying pipe 32, and the amount of the HMDS 100 supplied to the interior of the tank 3 is controlled by opening or closing of the valve 31. In the vicinity of the upper surface of the HMDS liquid contained in the tank 3, a float sensor 15 for detecting the level of the upper surface of the liquid HMDS 100 in the tank 3. A signal of the upper surface of the liquid HMDS 100 detected by the float sensor 15 is inputted to a controller 102. An opening/closing signal is outputted from the controller 102 to the valve 31. The float sensor 15 detects the level of the upper surface of the HMDS 100 in the tank 3 and outputs a suitable signal to the valve 31 so that the upper surface of the liquid HMDS 100 is always maintained to a predetermined height.

The height of the upper surface of the HMDS 100 is determined by the hysteresis characteristic of the float sensor 15, and the height difference of the upper surface of HMDS 100 is generally small.

A pipe 110 for supplying a nitrogen gas ($N_2$ gas) as a carrier gas to the interior of the tank 3 is connected to the upper portion of the tank 3 through a hole 27 in the cap 21. On the pipe 110 is provided a massflow controller 111 whose operation controls the amount of flow of the nitrogen gas ($N_2$ gas) supplied to the interior of the tank 3. An upstream portion of the pipe 110 is provided with a temperature adjusting device 112 for setting the temperature of a nitrogen gas ($N_2$ gas) in the pipe to a predetermined value.

HMDS 100 is supplied to the interior of the tank 3 via the HMDS supplying pipe 32. In the sealed tank 3, the HMDS 100 is evaporated to form a treating gas in a saturated state. In this case, the level of the upper surface of the liquid HMDS 100 in the tank 3 is detected by the float sensor 15 and the valve 31 is opened or closed by the controller 102 in such way that the level of the upper surface of the liquid HMDS 100 is always maintained to a predetermined height.

After a negative pressure is generated in the tank 3 by producing in the tank 3 a treatment gas which is a vapor of HMDS 100, the massflow controller 111 is operated to supply a nitrogen gas ($N_2$ gas) to the interior of the tank 3. The nitrogen gas ($N_2$ gas) accompanied the treating gas produced in the tank 3 and is sucked together with the treating gas in the treating device 1 under the negative pressure in the treating device 1 through a supplying pipe 34 for effecting communication between the tank 3 and the treating device 1. In this way, the treating gas is introduced into the treating device 1 and sprayed onto a wafer W mounted on a mount base 42, thereby accomplishing an AD treatment.

In this case, it is necessary that the density of the treating gas introduced into the treating device 1 be maintained to a predetermined value in order to perform the AD treatment uniformly. For maintaining a constant density, the amount of the vapor of the HMDS produced in the tank 3 can be adjusted by controlling the amount of the flow of the Nitrogen gas ($N_2$ gas) as a carrier gas and/or controlling the temperature of the nitrogen gas ($N_2$ gas) introduced into the tank 3.

Further, the density of the treating gas can be controlled by supplying or removing heat at the outside of the tank 3, or adjusting the temperature of the HMDS 100 to a predetermined value.

After having finished the AD treatment on the wafer W, a nitrogen gas ($N_2$ gas) is further supplied to the interior of the treating device 1 through the supplying pipe 34. Since no bubbling operation is performed in this embodiment, the upper surface of the liquid HMDS 100 is not disturbed but remains stationary. Thus, the level of the upper surface of the liquid HMDS may be detected by the float sensor 15 accurately. As a result, the level of the upper surface of the liquid HMDS 100 may be always maintained constant, and a stable amount of treating gas is evaporated. Thus, the treating gas having a constant density may be supplied to the treating device 1.

Figure 7:
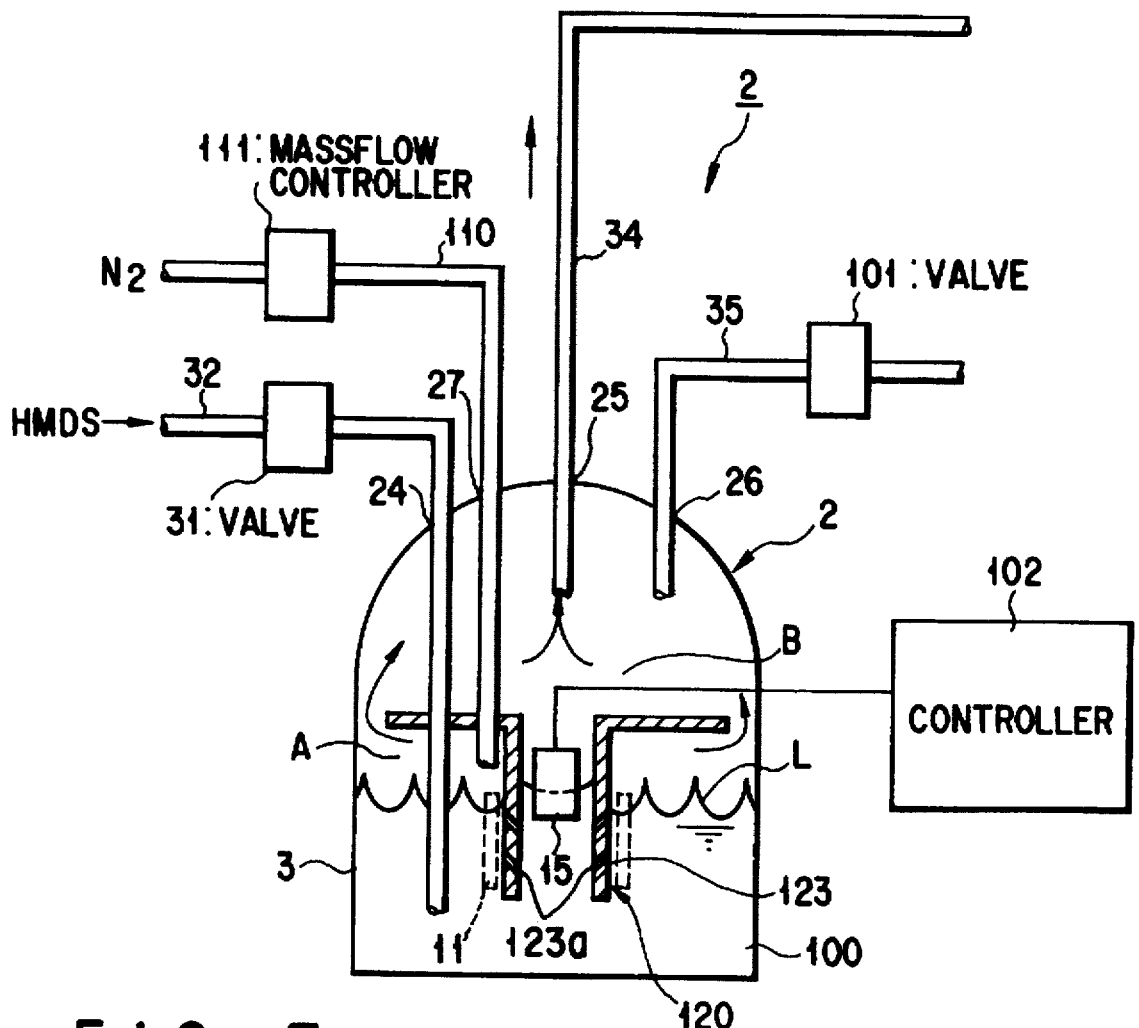
FIG. 7 is a view schematically showing the HMDS supplying apparatus having a tank whose interior is divided by means of dividing means as in FIG. 6.

When dividing means 120 is provided in the tank 3 of the HMDS supplying apparatus 2 as shown in FIG. 7, the upper surface of the liquid HMDS 100 can be detected more accurately.

In FIG. 7, a spiral pipe 11 having the same construction as the first embodiment is shown by dash lines to avoid a confusion. The spiral pipe 11 is wound around the tubular portion 123 of the dividing means 120. The tubular portion 123 has a plurality of inclined through holes 123a to communicate the inside and outside of the tubular portion to flow a liquid so that the liquid inside the portion 123 may be maintained at the same temperature as that of the liquid outside of the portion 123.

Figure 8:
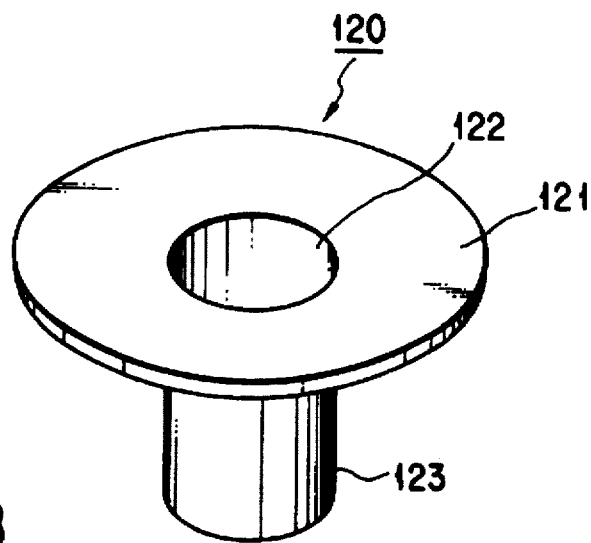
FIG. 8 is a general perspective view of the dividing means shown in FIG. 7.

As shown in FIG. 8, the dividing means 120 comprises a disc-like horizontal portion or plate 121 having a central hole 122 and a tubular portion 123 coaxially connected to the under surface the horizontal portion 121 to communicate with the central hole 122. As shown in FIG. 7, the horizontal portion 121 is disposed over the upper level L of the liquid HMDS 100 in the tank 3 and the lower portion of the tubular portion 123 is sunk in the liquid HMDS 100. In this way, the interior of the tank 3 is divided by the dividing means 120 into a plurality of regions, for example, into two regions; one region being a region A which is under the horizontal portion 121 and outside of the tubular portion 123 in the tank 3, and the other region being a region B which is over the horizontal portion 121 and includes the inner hollow part of the tubular portion 123.

Provision of the dividing means 120 allows the pipe 110 to open to the area A which is one of the areas in the tank 3 and is under the horizontal portion 121 outside of the tubular portion 123 and permits a nitrogen gas ($N_2$ gas) to supply to the area A thus separated by the dividing means 120. A float sensor 15 for detecting the level of the upper surface of the liquid HMDS 100 is provided in the inner hollow part of the tubular portion 123 which is a part of the region B formed by the part over the horizontal portion 121 in the tank 3 and the inner hollow part of the tubular portion 123.

In this connection, this embodiment has an advantage in that disturbance generated in the upper surface of the liquid HMDS in the region A under the horizontal portion 121 and outside of the tubular portion 123 in the tank 3 when the nitrogen gas ($N_2$ gas) is supplied from the pipe 110, is not transmitted to the region B divided by the dividing means 120 from the region A and formed by the part of the tank 3 over the horizontal portion 121 and the inner hollow part of the tubular portion 123 whereby an adverse effect which might be otherwise given to the upper surface of the liquid HMDS can be eliminated when the nitrogen gas ($N_2$ gas) is supplied to the tank 3. If disturbance is generated in the liquid HMDS 100 when liquid HMDS is supplied from the HMDS supplying tube 32 to the tank 3, the disturbance does not affect the stationary state of the upper surface of the liquid HMDS 100. Thus the float sensor 15 can detect the upper level or surface accurately. In this way, this embodiment allows the upper surface of the liquid HMDS 100 to be detected more accurately in a more stable state, making it easy to maintain the liquid level of the treating liquid to a constant level. Further, the horizontal portion 120 prevents the nitrogen gas ($N_2$ gas) supplied from the pipe 110 from passing the upper surface of the liquid HMDS 100 or the vicinity thereof and also prevents the nitrogen gas ($N_2$ gas) from directly entering the supplying pipe 110. Then, a treating gas (HMDS gas) generated by vaporization in the tank 3 may be securely supplied from the supplying pipe 34 to the treating device 1.

Figure 9:
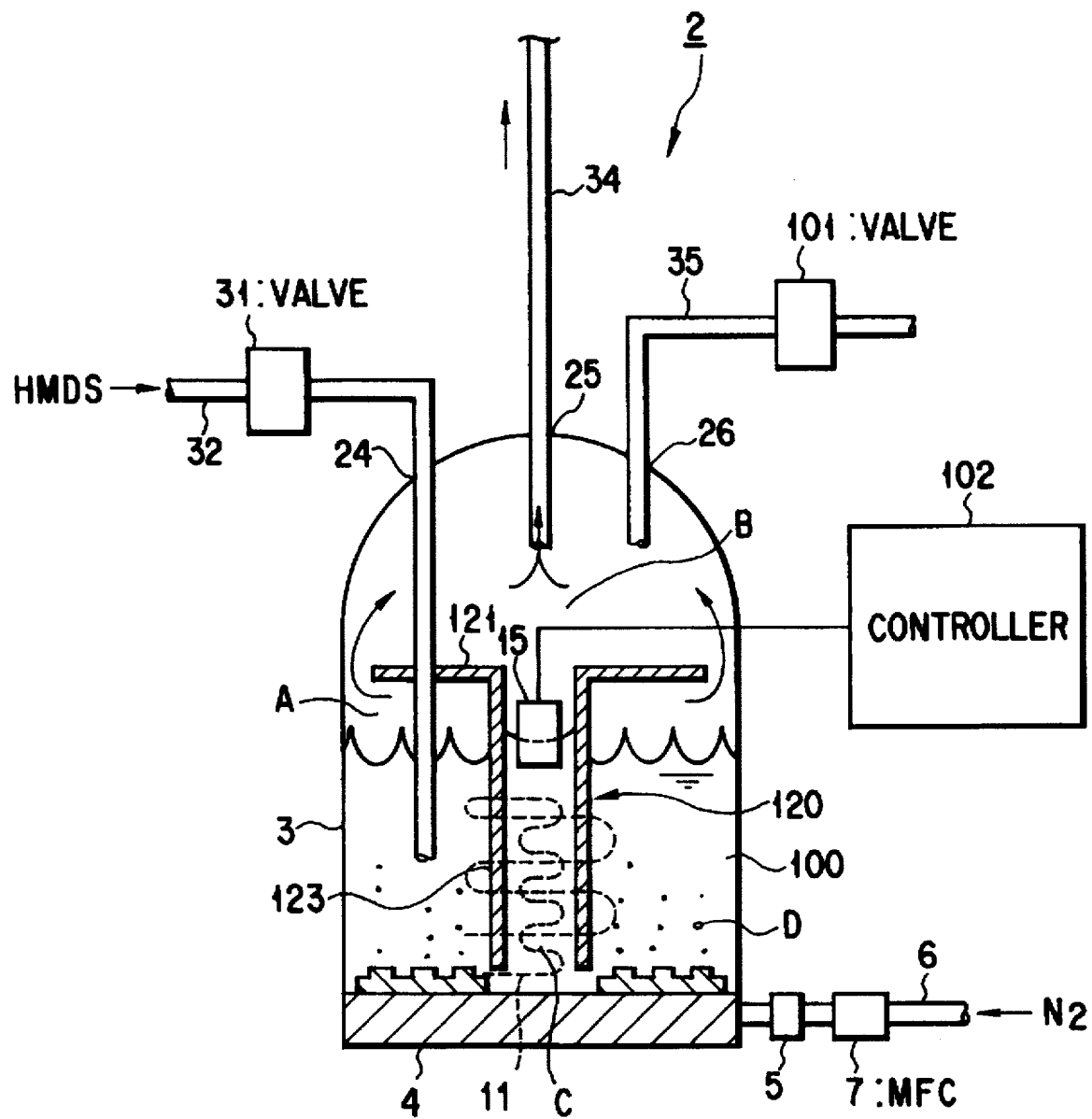
FIG. 9 is a view of another embodiment of the HMDS supplying apparatus as shown in FIG. 7.

A further embodiment of an HMDS supplying apparatus modified from the HMDS supplying apparatus of FIG. 7 will be described with reference to FIG. 9. The same elements of this embodiment as those of the embodiment of FIG. 7 are designated by the same reference numerals as those of the embodiment of FIG. 7, and detailed description thereof is omitted. The HMDS supplying apparatus 2 as shown in FIG. 9 intends to bubble a carrier gas in an HMDS 100 in a tank 3. The HMDS supplying apparatus 2 has such a structure that bubbles D of HMDS produced by the bubbling process do not enters region C which is defined by the inner hollow part of the tubular portion 123 of the dividing means 120 in which a float sensor 15 is located. Similarly to the embodiment of FIG. 7, this embodiment has an advantage in that the tubular portion 123 of the dividing means 120 may exclude disturbance of the upper surface of the liquid HMDS 100 due to introduction of a nitrogen gas ($N_2$ gas) into the liquid HMDS 100. When the HMDS 100 is disturbed in the region A upon supplying a liquid HMDS to the tank 3, the effect of disturbance can be prevented by the tubular portion 123. Thus, the level of the liquid HMDS may be detected accurately by the float sensor 15. In this way, this embodiment allows the upper surface of the liquid HMDS 100 to be detected more accurately in a more stable state, making it easy to maintain the liquid level of the treating liquid to a constant level. Further, the horizontal portion 121 prevents the nitrogen gas ($N_2$ gas) supplied from the pipe 110 from passing the upper surface of the liquid HMDS 100 or the vicinity thereof and also prevents the nitrogen gas ($N_2$ gas) from directly entering the supplying pipe 110, and a treating gas (HMDS gas) generated by vaporization in the tank 3 can be securely supplied from the supplying pipe 34 to the treating device 1.

In this embodiment, the spiral pipe 11 is coiled to have a large diameter portions which are wound around the cylindrical portion 123 and small diameter portions which are positioned therein, as shown by dash lines. Thus, the liquid inside and outside of the cylindrical portion 123 may be heated at the same temperature.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An apparatus for supplying a treating material, which has a tank containing a treating material in a liquid state, into which a chemically stable carrier gas is introduced, which is mixed with said treating material in a vaporized state, a mixture of said carrier gas and said treatment material in a vapored state supplied to a treating material supplying system, the improvement in which comprises:
 a tubular heat exchanger provided in said tank for conducting a fluid therethrough, to perform heat exchange between said fluid and said treating material in a liquid state, said heat exchanger having an upper portion and a lower portion and causing said fluid to flow from said lower portion toward said upper portion.

2. The apparatus according to claim 1, wherein said treating material of a liquid state is selected one from a liquid HMDS, a developing liquid and a resist liquid.

3. The apparatus according to claim 1, wherein said carrier gas includes an inert gas.

4. The apparatus according to claim 1, wherein said fluid is water at a room temperature or at a constant temperature.

5. The apparatus according to claim 1, which further comprises dividing means for dividing an interior of said tank at an upper level of the treating material in a liquid state into at least a first region into which said carrier gas is introduced and a second region in which the upper level of the treating material in a liquid state is detected.

6. An apparatus for supplying a treating material, comprising a tank containing a treating material in a liquid state, in which a chemically stable carrier gas is introduced, so that the carrier gas is mixed with said treating material in a vaporized state and a mixture of said carrier gas and said treating material in a vaporized state is supplied to a treating material supplying system;

a tubular heat exchanger provided in said tank for conducting a fluid therethrough, for performing heat exchange between said fluid and said treating material in a liquid state, said heat exchanger having an upper portion and a lower portion and causing said fluid to flow from said lower portion toward said upper portion, said fluid being used for adjusting a temperature of at least one of other treating devices.

7. The apparatus according to claim 6, wherein said treating material of liquid state is selected one from a liquid HMDS, a developing liquid and a resist liquid.

8. The apparatus according to claim 6, wherein said carrier gas includes an inert gas.

9. The apparatus according to claim 6, wherein said fluid is water at a room temperature or at a constant temperature.

10. The apparatus according to claim 6, which further comprises dividing means for dividing an interior of said tank at an upper level of the treating material, into at least a first region into which said carrier gas is introduced and a second region in which said level of said upper level of said treating material in a liquid state in said tank is detected.

11. The apparatus according to claim 6, wherein said at least one of other treating devices is used for at least one of resist coating treatment, developing treatment and heat treatment.

12. An apparatus for supplying a vaporized treating material to a treating device, which includes a tank having an interior with a carrier gas introduced thereinto and containing a liquid treating material with an upper level, said vaporized treating material being produced due to vaporization of said liquid treating material in said tank, said apparatus comprising:

dividing means for dividing said interior of said tank at said upper level of said liquid treating material into a first region into which said carrier gas is introduced and a second region in which the upper level of the treating material in a liquid state is detected.

13. The apparatus according to claim 12, wherein said treating material of liquid state is selected one from a liquid HMDS, a developing liquid and a resist liquid.

14. The apparatus according to claim 12, wherein said carrier gas includes an inert gas.

15. The apparatus according to claim 12, wherein said fluid is water at a room temperature or at a constant temperature.

16. The apparatus according to claim 12, which is a treating apparatus for performing an AD treatment under a negative pressure.

17. The apparatus according to claim 12, further comprising a tubular heat exchanger for conducting a fluid therethrough and provided in said tank, for performing heat exchange between said fluid and said treating material, said heat exchanger having an upper portion and a lower portion and causing said fluid to flow from said lower portion toward said upper portion.

18. An apparatus for supplying a mixture of a vapor treating material and a carrier gas into a treating apparatus, comprising:

a tank having an upper and bottom walls, in which a liquid treating material is received;

a heat exchanger disposed in the liquid treating material, the heat exchanger including a pipe extending from a lower level of the liquid treating material to an upper level thereof;

means for supplying a fluid into the heat exchanger to allow the fluid to flow in an extending direction in the pipe to perform heat exchange between the fluid flowing through the pipe and the liquid treating material;

means for controlling a temperature and/or flow rate of the fluid supplied to the heat exchanger;

means for supplying a chemically stable carrier gas into the tank, so that the carrier gas is mixed with a vapor of the treating material; and transporting the mixture of the carrier gas and the vapor of the treating material into the treating apparatus.

19. The apparatus according to claim 18, which further includes means for detecting the upper level of the liquid treating material in the tank, and means for adding a liquid treating material into the tank to control the upper level thereof, according to the detected result of the detecting means.

20. The apparatus according to claim 19, wherein said pipe has a spiral portion in the liquid treating material around a vertical axis, and said detecting means includes a float sensor floated on the liquid treating material, and disposed in the spiral portion of the heat exchanger.

21. The apparatus according to claim 18, wherein said bottom wall of the tank has a bubble generator of porous material facing the lower level of the liquid treating material, and said means for supplying a chemically stable carrier gas includes a supply pipe connected to the bubble generator to supply the carrier gas into the bubble generator.

22. An apparatus for supplying a mixture of a vapor treating material and a carrier gas into a treating apparatus, comprising:

a tank for receiving a liquid treating material therein;

means disposed in the tank, for controlling the temperature of the liquid treating material to be constant;

a dividing member having a lower portion inserted into the liquid treating material form the upper level, for horizontally dividing a space in the tank into a first region and a second region;

means for supplying a chemically stable carrier gas into the first region of the tank, so that the carrier gas is mixed with a vapor of the treating material;

a floating sensor for detecting the upper level of the liquid treating material, the sensor floated on the upper level of the liquid treating material in the second region;

transporting the mixture of the carrier gas and the vapor of the treating material into the treating apparatus.

23. The apparatus according to claim 22, wherein the lower part of said dividing member has a cylinder the outside of which defines the first region and the inside of which defines the second region.

* * * * *